United States Patent
Kraus et al.

(10) Patent No.: US 8,519,291 B2
(45) Date of Patent: Aug. 27, 2013

(54) CONTROL DEVICE FOR AN ELECTRICAL APPLIANCE

(75) Inventors: Randolf Kraus, Bretten (DE); Andreas Kleinhans, Eppingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 215 days.

(21) Appl. No.: 12/899,099

(22) Filed: Oct. 6, 2010

(65) Prior Publication Data

US 2011/0079502 A1    Apr. 7, 2011

(30) Foreign Application Priority Data

Oct. 7, 2009    (DE) .......................... 10 2009 049 559

(51) Int. Cl.
    *H03K 17/975* (2006.01)

(52) U.S. Cl.
    USPC ........................................... 200/600; 345/173

(58) Field of Classification Search
    USPC .................. 200/5 R, 5 A, 600, 511, 512, 296; 341/22, 33, 34; 345/156, 157, 173, 176
    See application file for complete search history.

(56) References Cited

U.S. PATENT DOCUMENTS

| | | | |
|---|---|---|---|
| 4,264,903 A | | 4/1981 | Bigelow |
| 4,999,462 A | * | 3/1991 | Purcell ........................ 178/18.03 |
| 5,917,165 A | | 6/1999 | Platt et al. |
| 5,967,299 A | * | 10/1999 | de Richecour et al. ....... 200/512 |
| 5,973,417 A | | 10/1999 | Goetz et al. |
| 6,121,869 A | * | 9/2000 | Burgess ........................... 338/99 |
| 6,724,324 B1 | * | 4/2004 | Lambert ........................... 341/33 |
| 7,511,242 B2 | | 3/2009 | Winkler |
| 7,525,062 B2 | * | 4/2009 | Adam et al. .................... 200/600 |
| 7,663,607 B2 | * | 2/2010 | Hotelling et al. .............. 345/173 |
| 8,121,283 B2 | * | 2/2012 | Peng et al. ................. 379/433.07 |
| 2006/0243462 A1 | | 11/2006 | Schilling et al. |
| 2007/0051610 A1 | * | 3/2007 | Weiss .............................. 200/600 |
| 2007/0262962 A1 | | 11/2007 | XiaoPing et al. |
| 2007/0273560 A1 | | 11/2007 | Hua et al. |
| 2009/0140996 A1 | * | 6/2009 | Takashima et al. ........... 345/173 |
| 2010/0007531 A1 | | 1/2010 | Fluhrer |

FOREIGN PATENT DOCUMENTS

| | | |
|---|---|---|
| DE | 10 2004 024 835 B3 | 10/2005 |
| EP | 1416636 A2 | 5/2004 |
| WO | WO 2007/036247 A1 | 4/2007 |

OTHER PUBLICATIONS

Office Action for German Application No. 10 2009 049 559.2 dated May 21, 2010.
European Patent Office, Search Report for corresponding Application No. EP10186362, dated Mar. 1, 2012.

* cited by examiner

*Primary Examiner* — Michael Friedhofer
(74) *Attorney, Agent, or Firm* — Alston & Bird LLP

(57) ABSTRACT

A control device for an electrical appliance has a control panel wherein a plurality of capacitive sensor elements for a capacitive proximity switch are arranged under the control panel and are arranged in a continuous row, in order to form an elongated slider for operation by application of a finger and drawing the finger over them. The sensor elements are all identical and have a rectangular shape, wherein they are each arranged with one of their first sides facing one another and with all of their sides parallel to one another. They are aligned in the same way with respect to the continuous row, wherein the first sides are rotated through an angle of between 46° and 75° to form the row along which the sensor elements are arranged.

8 Claims, 4 Drawing Sheets

CONTROL DEVICE FOR AN ELECTRICAL APPLIANCE

CROSS REFERENCE TO RELATED APPLICATIONS

This application claims priority to German Application Number 10 2009 049 559.2, filed on Oct. 7, 2009, the contents of which are incorporated by reference for all that it teaches.

FIELD OF THE INVENTION

The invention relates to a control device for an electrical appliance, wherein the control device has a control panel with capacitive sensor elements, in order to form a capacitive contact or proximity switch.

BACKGROUND OF THE INVENTION

The prior art of U.S. Patent Publication 2010/007531 discloses a control device which operates with piezoelectric sensor elements, where bending is detected when a finger is applied to a control panel above the sensor elements.

Furthermore, WO 2007/036247 A discloses how an elongated control device is in the form of a so-called slider, and is operated by application of a finger and drawing it in the form of a line over the slider. In particular, this makes it possible, for example, to set a power in a plurality of levels or in a specific range, very easily and effectively.

SUMMARY

The invention is based on providing a control device of the type mentioned initially, by means of which problems from the prior art can be avoided and which, in particular, creates a capability to design such a control device to be simple, and to provide it with reliable operation.

Advantageous and preferred refinements of the invention are the subject matter of the further claims, and will be explained in more detail in the following text. The wording of the claims is included in the content of the description, by express reference.

One embodiment of the invention provides that the capacitive sensor elements are arranged in a continuous row and thus form an elongated control device for operation as described above, in that a finger is placed on it, in particular on the control panel, and is drawn over it. The sensor elements are in this case advantageously arranged at the same distance from one another. Furthermore, the sensor elements are all the same or identical shape, and can have advantageously a rectangular shape. According to one embodiment of the invention, the sensor elements are arranged such that each of their first sides faces one another. In particular, the mutually facing sides and therefore also the other sides are each aligned in a parallel manner, and the sensor elements are aligned in the same way with respect to the continuous row, and are rotated at the same angle. This is because said first sides are rotatable with respect to the row or in the direction of their extent through an angle of between 15° and 90°. In one advantageous refinement, the angle may be between 45° and 80°, preferably between 46° and 75°. The angle should be different from, or some more than 45°, especially in the case where the sensor elements are rectangular and do not deviate too much from a square form. In this case, the angle can alternatively be somewhat less than 45°, for example between 15° and 44°.

This mutually rotated or offset arrangement of the sensor elements makes it possible for them to almost overlap, or even to actually overlap somewhat. This allows better linearity and accuracy in the determination of a position of a finger placed on or above them. In particular, with the normal evaluation methods for capacitive sensor elements in contact switches, for example, corresponding to U.S. Pat. No. 5,917,165 or U.S. Pat. No. 5,973,417, this results in a stronger signal level when a finger is actually in the center between two sensor elements along the row of the sensor elements. Furthermore, in the case of capacitive sensor elements, it should be remembered that these should not be arranged very close to one another and should still be a certain distance apart from one another in order that, as a result of the decrease in the signal level when a finger approaches the intermediate space between the sensor elements starting from a center point of the sensor element, this can also be distinguished with sufficient accuracy. In addition, the sensor elements must never touch. A distance may be in the order of magnitude of less than the smallest extent of a sensor element, that is to say, in general, somewhat less than the width or short side of an elongated sensor element.

In a further embodiment of the invention, the sensor elements are not only rectangular, but have a long side and a short side, especially with a length difference of at least 10%. Their oblique positioning or possible overlapping is particularly advantageous when their long sides face one another, which means that they are transversal to the length extension of the row. In this case, the sensor elements may be designed to be approximately twice as long as they are wide, preferably at the maximum twice as long.

The row along which the sensor elements are arranged is advantageously a straight line. In this case, as described, all the sensor elements are aligned in the same way.

It is even possible for adjacent sensor elements to overlap. They can overlap such that they have a directional component which overlaps somewhat along the longitudinal extent of the row. The overlap should be relatively small, for example at least 5% to 20% of the length of a sensor element. This overlap is also related to the oblique positioning of the sensor elements relative to the longitudinal extent of the row. In this case, it has actually been found to be advantageous for the sensor elements not to be elongated, for example, by being approximately twice as long as they are wide, and for the angle of the oblique positioning and the distance between them to be designed such that this actually results in a small overlap.

In principle, the capacitive sensor elements can be designed or produced as required since, essentially, only their area which is electrically conductive is of importance, and can be placed on the underneath of the control panel. Sensor element bodies are advantageously used which are composed of electrically conductive and elastic material, in particular a plastic as is known from the already cited U.S. Pat. No. 5,917,165. The sensor element bodies are then advantageously in block form and their top is fitted to the underneath of the control panel. They can themselves be arranged on and have electrical contact made with them on a printed circuit board. The height of a sensor element body such as this should advantageously be less than its length and width, for example one quarter to one third of the width.

These and further features are described not only in the claims but also in the description and the drawings, where the individual features can each be implemented on their own or in groups of two or more in the form of sub-combinations for an embodiment of the invention or in other fields, and may represent advantageous embodiments, worthy of protection in their own right, for which protection is claimed here. The subdivision of the application into individual sections and intermediate headings does not restrict the generality of the statements made under these headings.

BRIEF DESCRIPTION OF THE DRAWINGS

Exemplary embodiments of the invention will be explained in more detail in the following text, and are illustrated schematically in the drawings, in which.

DETAILED DESCRIPTION OF THE EXEMPLARY EMBODIMENTS

Figure 1:
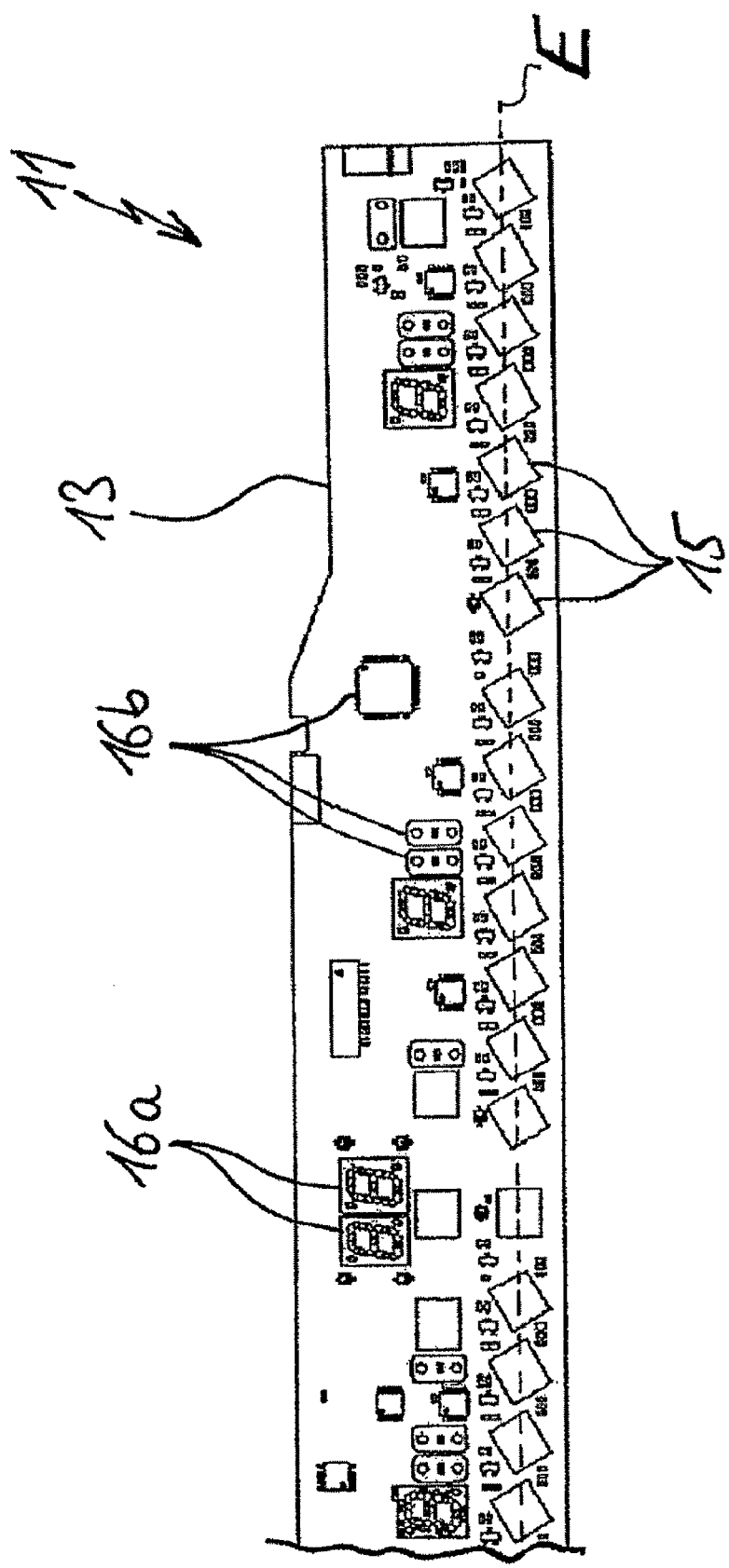
FIG. 1 shows a plan view of a control device according to the invention with a printed circuit board on which sensor elements are arranged in a line.

FIG. 1 shows one example of a control device 11 according to one embodiment of the invention, which has a printed circuit board 13 on which a multiplicity of capacitive sensor elements 15 are arranged, to be precise in two groups, all along one extent line E, which is represented by a dashed line. In this case, the sensor elements 15 are arranged relatively close to one another and, as can clearly be seen, offset obliquely with respect to one another and rotated with respect to the line E, to be precise in this case each rotated through an angle of about 30° in the anticlockwise direction. This means that the above-mentioned first sides of the sensor elements, which face one another, are at an angle of about 60° to the line E. As can be seen, the sensor elements 15 do not yet overlap in the direction of the line E, although the corresponding corners of the sensor elements are each close to one another. However, one advantage according to one embodiment of the invention is a better evaluation capability that can be achieved even without such an overlap. The rectangular sensor elements 15 are longer in a first direction oblique to the upper right than in the other second direction to the upper left, especially they are about 10% longer in the first direction.

Further components are provided on the printed circuit board 13 to be precise, both an LED 16a and seven-segment displays, as well as other electrical and electronic components 16b.

Figure 2:
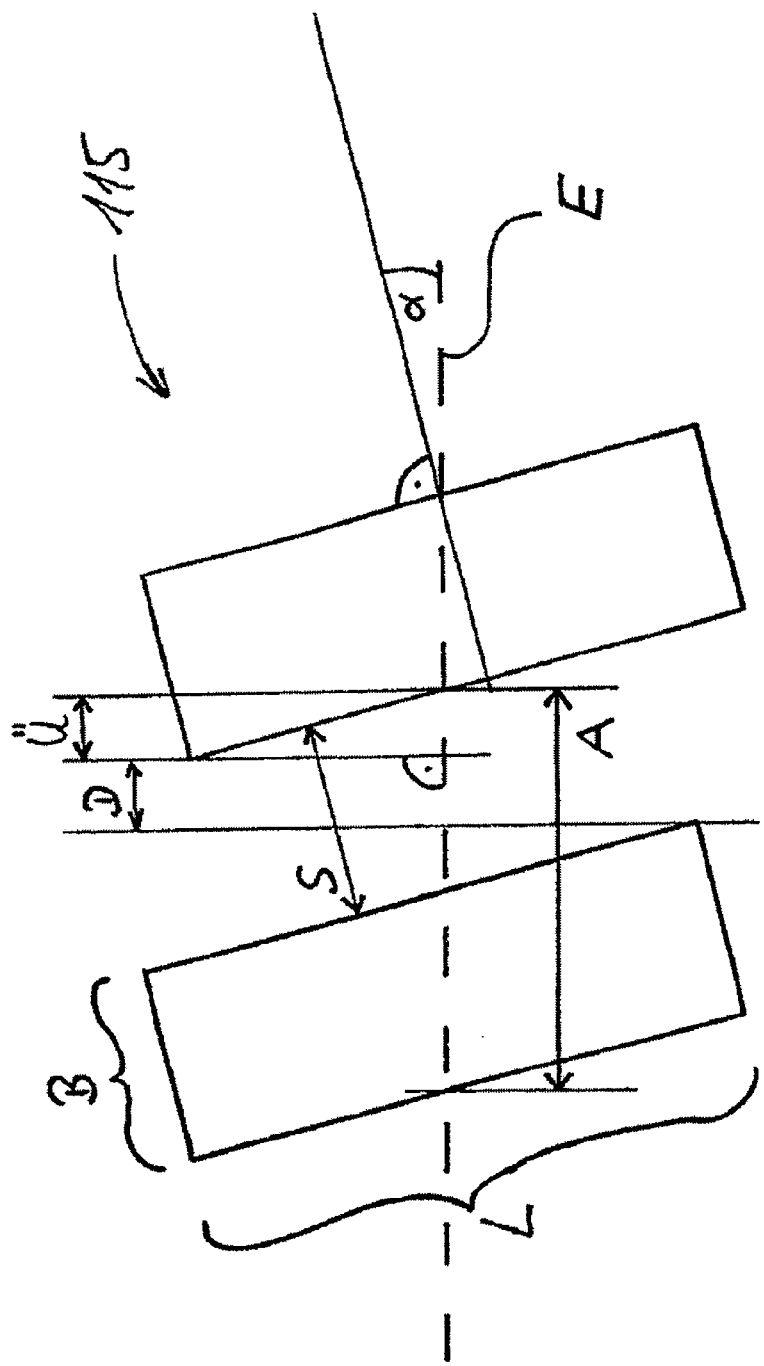
FIGS. 2 and 3 show enlargements of two schematical illustrations of two different sensor elements similar to FIG. 1, which are arranged obliquely offset with respect to one another.

FIG. 2 shows an enlargement of sensor elements 115 of somewhat different design, to be precise, narrower and longer, which are once again rotated through an angle α in the counter-clockwise direction with respect to an extent line "E," to be precise in this case through only about 15°. Furthermore, the width "B" of a sensor element 115 is shown, as well as the gap width "S," which indicates the distance between mutually facing first sides of the sensor elements 115. "L" denotes the length and "B" the width of a sensor element 115. "Ü" denotes the overhang by which the left-hand upper corner of the right-hand sensor element 115 overlaps the perpendicular to the intersection point of the first long side of the sensor element 115 with the line E. "A" denotes the distance between the centre points of the sensor elements, and this also corresponds to the distance between the sensor elements 115 along the line "E."

A difference "D" is the amount which results when the width "B" of a sensor element and twice the overhang "Ü" are subtracted from the distance "A." "D" therefore corresponds to the distance between those two points of the sensor elements 115 which are located closest to one another, in the direction of the line "E."

Figure 3:
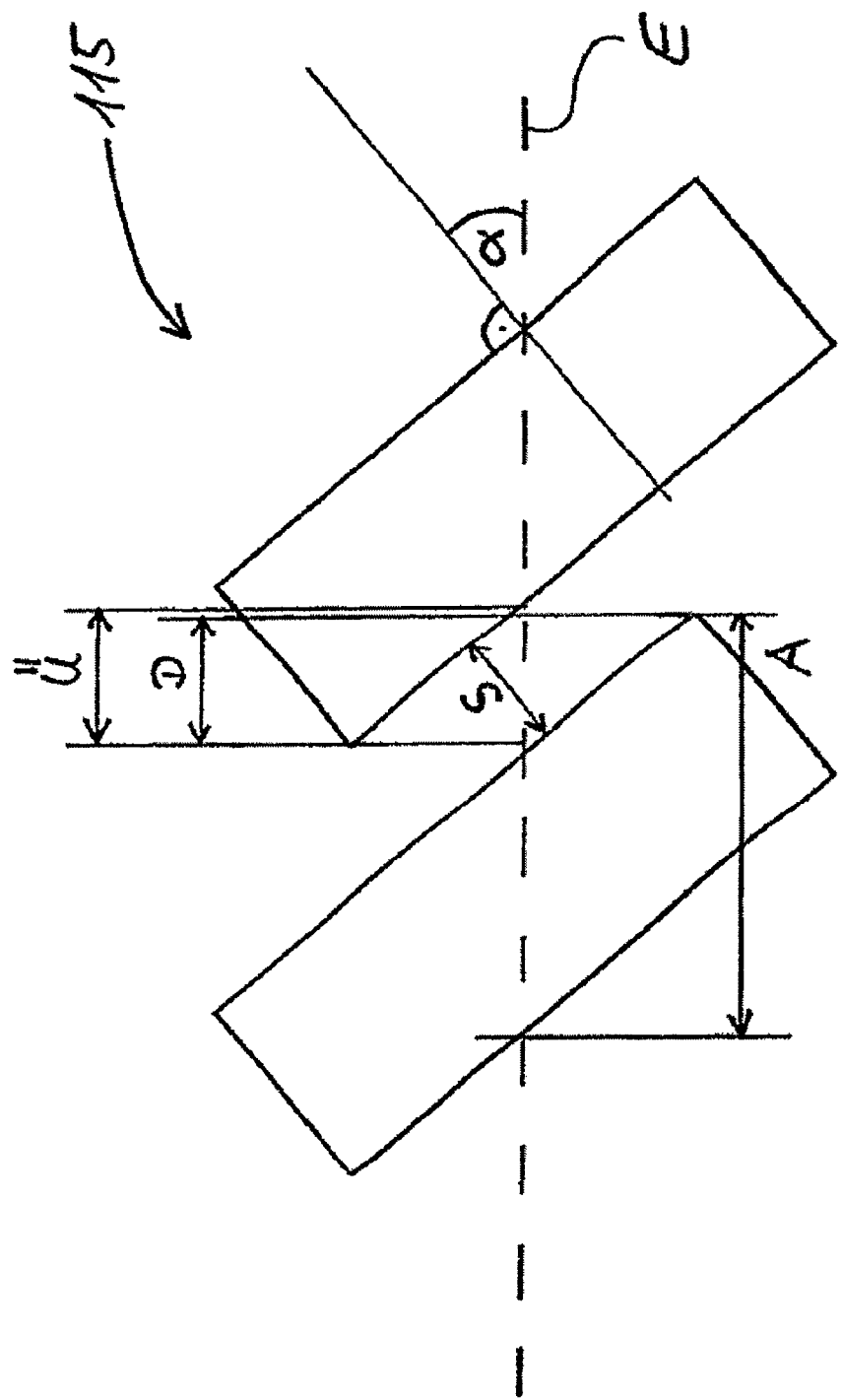

FIG. 3 shows how the right-hand sensor element 115 actually overlaps the left-hand sensor element 115 when the distance "A" is the same and the angle α is about 40°, to be precise by the amount "D," which, when calculated, is negative in comparison to that from FIG. 2.

The value for S is determined using the formula of Equation 1:

$$S=(A-B-(B/2)\times\sin(\alpha)\times\tan(\alpha))\times\cos(\alpha) \qquad \text{Eq. 1}$$

The overhang Ü is calculated using the formula of Equation 2:

$$\ddot{U}=(L/2)\times\sin(\alpha) \qquad \text{Eq. 2}$$

The angle α can therefore be determined using Equation 3:

$$\alpha=\arcsin(2\,\ddot{U}/L) \qquad \text{Eq. 3}$$

The following table, Table 1, indicates the angle α, the gap width S and the amount D for a sensor element of width B=8 mm, for increasing values of the overhang Ü. This is, of course, also dependent on the value of the distance A. In FIG. 2, the sensor elements 115 do not yet overlap one another, but in contrast, this is the case in FIG. 3.

TABLE 1

| For B = 8 mm | Ü/mm | α/degrees | S/mm | D/mm |
|---|---|---|---|---|
|  | 0.5 | 7.2 | 1.9 | 1 |
|  | 1 | 14 | 1.7 | 0 |
| Overlap | 1.5 | 22 | 1.3 | −1 |
| Overlap | 2 | 30 | 0.7 | −2 |
| Collision | 3 | 48 | −0.9 | −0.9 |
| Collision | 4 | 90 | −4 | −4 |

Figure 4:
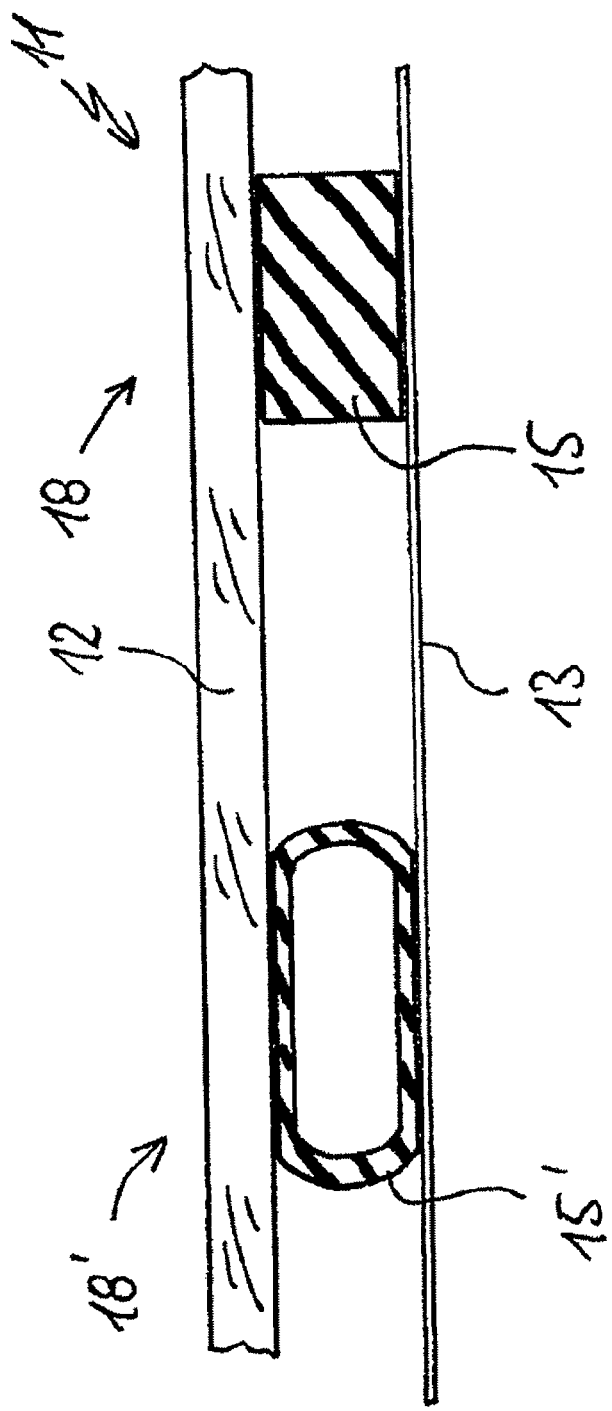
FIG. 4 shows a schematic side section through a control device according to the invention, with a control panel, above different sensor elements.

FIG. 4 shows a further schematic section illustration of a control device 11 according to the invention. The printed circuit board 13 is located under a control panel 12 of the control device 11, at some distance from it and parallel to it. The illustration here shows two sensor elements 15 and 15' on the printed circuit board 13. The right-hand sensor element 15 is essentially in the form of a block, that is to say, a solid cube-shape and is composed of elastic material, in particular electrically conductive plastic. The top of the sensor element 15, which is pressed onto the underneath of the control panel 12, forms a capacitive contact switch 18 on the corresponding area on the top of the control panel 12, as those skilled in the art will be aware. The other embodiment of the sensor element 15' on the left in FIG. 3 has a cavity, and is therefore in the form of a cavity section such as disclosed in U.S. Pat. No. 7,511,242. In this case as well, the top of the sensor element 15' on the underneath of the control panel 12 forms a capacitive contact switch 18' on the top thereof.

The invention claimed is:

1. A control device for an electrical appliance, comprising:
a control panel; and
a plurality of capacitive sensor elements for a capacitive contract switch or
proximity switch arranged under said control panel, wherein said plurality of capacitive sensor element are arrange in an elongated, continuous row, for operation by application of a finger and drawing said finger over said plurality of capacitive sensor elements, wherein further said capacitive sensor elements are identical in shape, wherein said shape comprises a rectangular shape with a first side and a second side, wherein each of said plurality of capacitive sensor elements are arranged with one of said first sides facing one another and are each arranged with all of their said sides parallel to one another, such that said plurality of capacitive sensor elements are aligned in the same way with respect to said continuous row, wherein said first sides are rotated through an angle of between 15° and 90° to said continuous row along which said sensor elements are arranged, wherein said sensor elements are rotated through an angle of between 15° and 44° or between 45° and 80°, and wherein said sensor elements are formed by electrically conductive, elastic sensor element bodies, which are placed on a carrier underneath of said control panel, wherein their top is fitted to the underside of the control panel.

2. The control device according to claim 1, wherein said sensor elements are rotated through an angle of between 46° and 75°.

3. The control device according to claim 1, wherein said sensor elements have a long side and a short side.

4. The control device according to claim 3, wherein said sides of said sensor elements have a length difference of at least 10%.

5. The control device according to claim 3, wherein said long sides of said sensor elements face one another.

6. The control device according to claim 1, wherein said row along which said sensor elements are arranged in a straight line.

7. The control device according to claim 1, wherein adjacent sensor elements overlap at least partially in a directional component of a longitudinal extent of said row by at least 5% to 20% of their length.

8. The control device according to claim 1, wherein said sensor element bodies have a height which is less than a width and a length of said sensor element body.

* * * * *